United States Patent
Tokunaga

(10) Patent No.: US 8,912,941 B2
(45) Date of Patent: Dec. 16, 2014

(54) ANALOG-DIGITAL CONVERSION CIRCUIT AND METHOD FOR DRIVING THE SAME

(71) Applicant: Panasonic Corporation, Osaka (JP)

(72) Inventor: Yusuke Tokunaga, Hyogo (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 14/116,294

(22) PCT Filed: Feb. 21, 2013

(86) PCT No.: PCT/JP2013/000978
§ 371 (c)(1),
(2), (4) Date: Nov. 7, 2013

(87) PCT Pub. No.: WO2013/136676
PCT Pub. Date: Sep. 19, 2013

(65) Prior Publication Data
US 2014/0077985 A1 Mar. 20, 2014

(30) Foreign Application Priority Data
Mar. 14, 2012 (JP) ................. 2012-057903

(51) Int. Cl.
H03M 1/12 (2006.01)
H03M 3/02 (2006.01)
H03M 3/00 (2006.01)

(52) U.S. Cl.
CPC . *H03M 3/32* (2013.01); *H03M 3/02* (2013.01)
USPC ........... 341/155; 341/123; 341/143; 341/118; 341/120

(58) Field of Classification Search
CPC . H03M 1/1215; H03M 1/1245; H03M 1/502; H03M 1/00; H03M 1/12; H03M 1/1009; H03M 1/1225; H03M 3/02; H03M 1/06; H03M 1/0624
USPC ................. 341/123, 118, 120, 143, 155, 161
See application file for complete search history.

(56) References Cited

U.S. PATENT DOCUMENTS 4,371,850 A * 2/1983 Klement ................... 341/143
5,266,952 A * 11/1993 Stone et al. ................. 341/156

(Continued)

FOREIGN PATENT DOCUMENTS

| JP | 05-070035 U | 9/1993 |
| JP | 10-322214 A | 12/1998 |
| JP | 2000-236259 A | 8/2000 |

OTHER PUBLICATIONS

Márkus et al., "Theory and Applications of Incremental delta-sigma Converters," IEEE Transactions on Circuits and System-1: Regular Papers, vol. 51, No. 4, Apr. 2004, pp. 678-690.

(Continued)

*Primary Examiner* — Linh Nguyen
(74) *Attorney, Agent, or Firm* — McDermott Will & Emery LLP

(57) ABSTRACT

An analog-to-digital conversion circuit includes: a clock generating circuit which generates a clock signal including a first initial period and plural normal periods following the first initial period, the first initial period being one of a high period and a low period and being a first period immediately after a reset release, each of the normal periods being one of a high period and a low period and shorter than the first initial period; and an incremental analog-to-digital converter which operates using the clock signal.

15 Claims, 17 Drawing Sheets

(56) References Cited

U.S. PATENT DOCUMENTS

| | | | |
|---|---|---|---|
| 6,147,633 A | 11/2000 | Ukawa et al. | |
| 6,232,905 B1 * | 5/2001 | Smith et al. | 341/155 |
| 6,339,390 B1 * | 1/2002 | Velazquez et al. | 341/120 |
| 6,879,278 B2 * | 4/2005 | Watanabe et al. | 341/155 |
| 7,084,791 B2 * | 8/2006 | Cesura et al. | 341/118 |
| 7,268,719 B2 * | 9/2007 | Terazawa et al. | 341/157 |
| 7,446,686 B2 | 11/2008 | Rueger et al. | |
| 8,081,098 B2 | 12/2011 | Yoo et al. | |
| 8,176,225 B2 * | 5/2012 | Guido et al. | 710/69 |
| 8,350,740 B2 * | 1/2013 | Akita | 341/122 |
| 8,681,028 B2 * | 3/2014 | Terazawa | 341/120 |
| 8,730,073 B1 * | 5/2014 | Wang et al. | 341/122 |

OTHER PUBLICATIONS

Silva et al., "Wideband low-distortion delta-sigma ADC topology," IEEE Electronics Letters, vol. 37, No. 12, Jun. 2001, pp. 737-738.
International Search Report for International Application No. PCT/JP2013/000978 mailed Apr. 16, 2013, 8 pages.

* cited by examiner

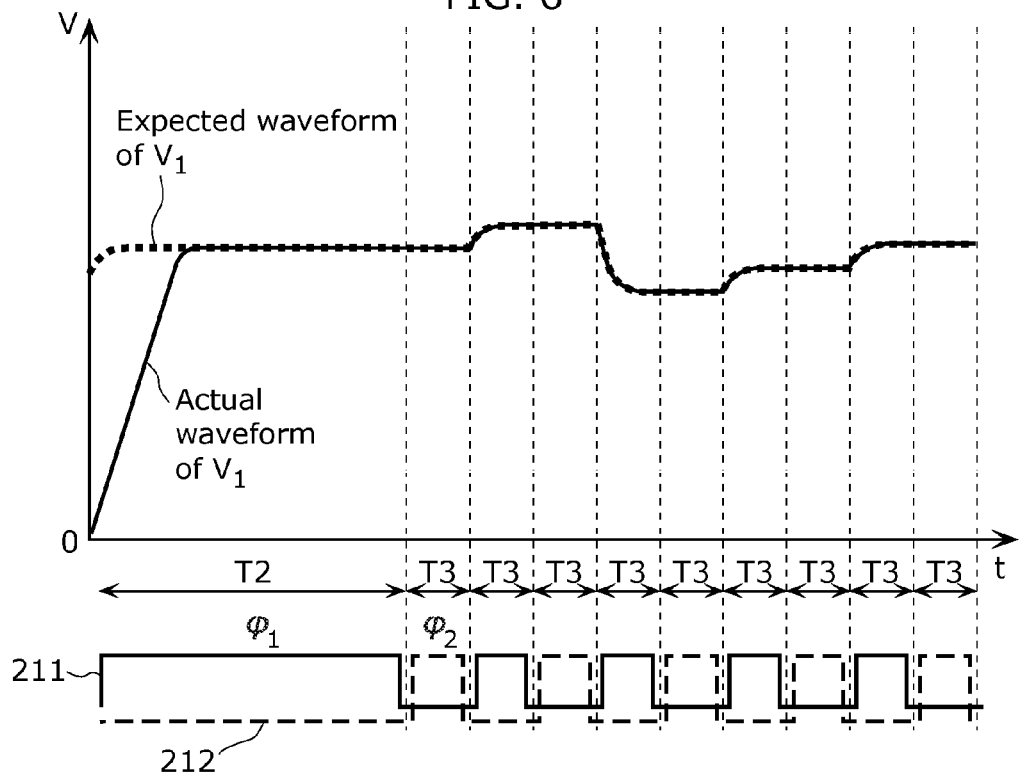
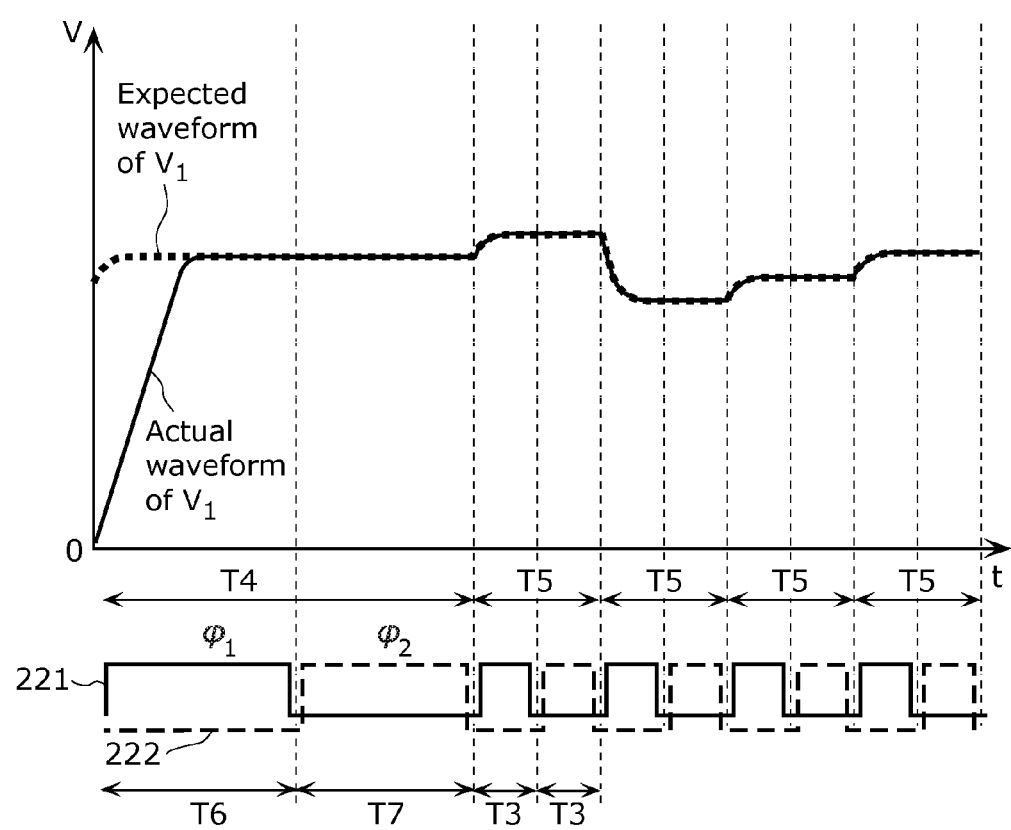

ANALOG-DIGITAL CONVERSION CIRCUIT AND METHOD FOR DRIVING THE SAME

RELATED APPLICATIONS

This application is the U.S. National Phase under 35 U.S.C. §371 of International Application No. PCT/JP2013/000978, filed on Feb. 21, 2013, which in turn claims the benefit of Japanese Application No. 2012-057903, filed on Mar. 14, 2012, the disclosures of which are incorporated by reference herein.

TECHNICAL FIELD

The present invention relates to analog-to-digital conversion circuits and control methods thereof, and particularly to an analog-to-digital conversion circuit having an incremental analog-to-digital converter.

BACKGROUND ART

There are a variety of types of analog-to-digital (AD) converters including a flash converter, a successive-approximation converter, a pipeline converter, a cyclic converter, and a ΔΣ modulator converter. In particular, the cyclic converter and the ΔΣ modulator converter are capable of improving conversion accuracy by increasing the number of conversion cycles, and therefore can be regarded as an incremental AD converter.

In an actual design, in the case of a circuit configuration of the cyclic converter, the accuracy of an analog element (especially amplifier element) limits the accuracy of the whole system, so that there is a limit to the improvement in the accuracy. On the other hand, in the case of a circuit configuration of the ΔΣ modulator converter, the conversion accuracy can be improved by simply increasing only the number of conversion cycles instead of improving the accuracy of an analog element that is used. As described above, Non Patent Literature (NPL) 1 discloses that the circuit configuration of the ΔΣ modulator converter is suitable specifically for the incremental AD converter. NPL 1 also discloses that the accuracy can be improved by combining a 2nd- or higher-order ΔΣ modulator AD converter and a decimation filter which calculates an output pulse train.

CITATION LIST

Non Patent Literature

[NPL 1] J. Markus, J. Silva, G. C. Temes, "Theory and Applications of Incremental ΔΣ Converters," IEEE TCAS-I, Vol. 51, No. 4, pp. 678-690, April 2004.
[NPL 2] J. Silva, J. Steensgaard, G. C. Temes, "Wideband low-distortion delta-sigma ADC topology," IEEE Electronics Letters, Vol. 37, No. 12, pp. 737-738, June 2001.

SUMMARY OF INVENTION

Technical Problem

However, in such an AD converter, it is required to improve the accuracy while suppressing an increase in power consumption.

In view of this, the present invention has an object to provide an AD conversion circuit which is capable of improving the accuracy while suppressing an increase in power consumption.

Solution to Problem

In order to achieve the aforementioned object, the AD conversion circuit according to an aspect of the present invention is an analog-to-digital conversion circuit which converts an analog input signal into a digital output signal, the analog-to-digital conversion circuit including: a clock generating circuit which generates a clock signal including a first initial period and plural normal periods following the first initial period, the first initial period being one of a high period and a low period and being a first period immediately after a reset release, each of the normal periods being one of a high period and a low period and shorter than the first initial period; and an analog-to-digital converter which is an incremental analog-to-digital converter that operates using the clock signal, in which the analog-to-digital converter includes: an integrator which generates an integrated value according to a voltage of the analog input signal; a comparator which generates the digital output signal by comparing the integrated value and a predetermined reference voltage; and a digital-to-analog converter which generates an analog signal according to the digital output signal and provides the generated analog signal to the integrator It is to be noted that these general and specific aspects may be implemented using a system, a method, or an integrated circuit, and any combination of systems, methods, and integrated circuits.

Advantageous Effects of Invention

As described above, the present invention can provide an AD conversion circuit which is capable of improving the accuracy while suppressing an increase in power consumption.

BRIEF DESCRIPTION OF DRAWINGS

FIG. 6 is a timing chart showing an example of an internal waveform of the AD conversion circuit according to Embodiment 1.
FIG. 7 is a timing chart showing an example of an internal waveform of the AD conversion circuit according to Embodiment 1.

DESCRIPTION OF EMBODIMENTS (Underlying Knowledge Forming Basis of the Present Invention)

The inventor of the present invention has found the following problems.

In the conventional ΔΣ modulator AD convertor (hereinafter referred to as ΔΣ AD convertor), when current passing through an amplifier is reduced for low power consumption of the entire system, the driving capability of the amplifier is degraded. As a result, in a period from the initial reset state to a steady state which shows an expected behavior (hereinafter referred to as an initial transition period), an error (hereinafter referred to as an initial transition error) is observed between an actual waveform and an expected waveform (expected value).

Figure 1:
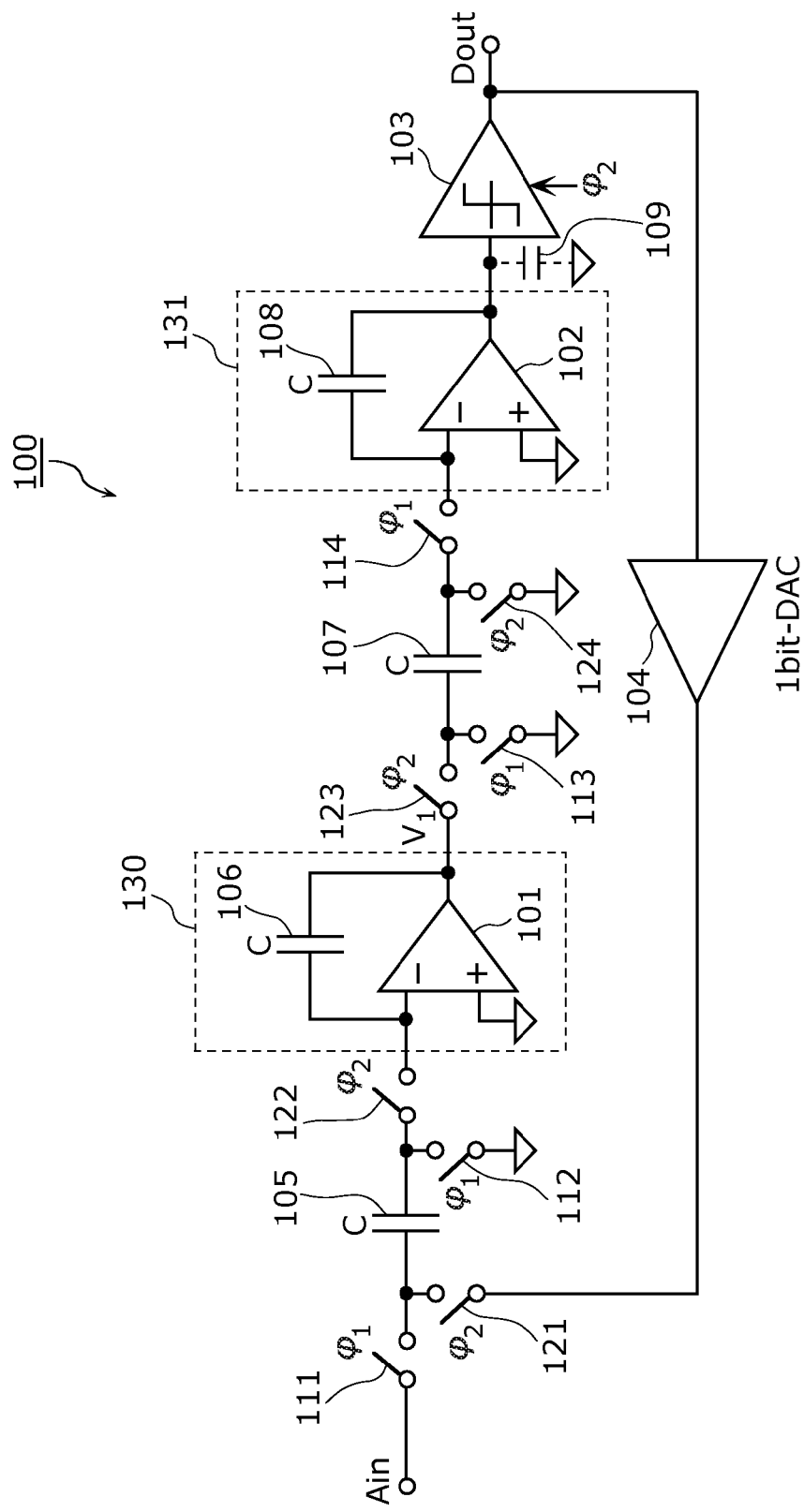
FIG. 1 is a circuit diagram showing an example of an AD converter according to an embodiment.

FIG. 1 is a circuit diagram showing a configuration of a typical 2nd-order ΔΣ AD converter 100. Moreover, FIG. 2 is a diagram showing the actual waveform and the expected waveform of an output voltage $V_1$ of an amplifier 101 in the ΔΣ AD converter 100.

Figure 2:
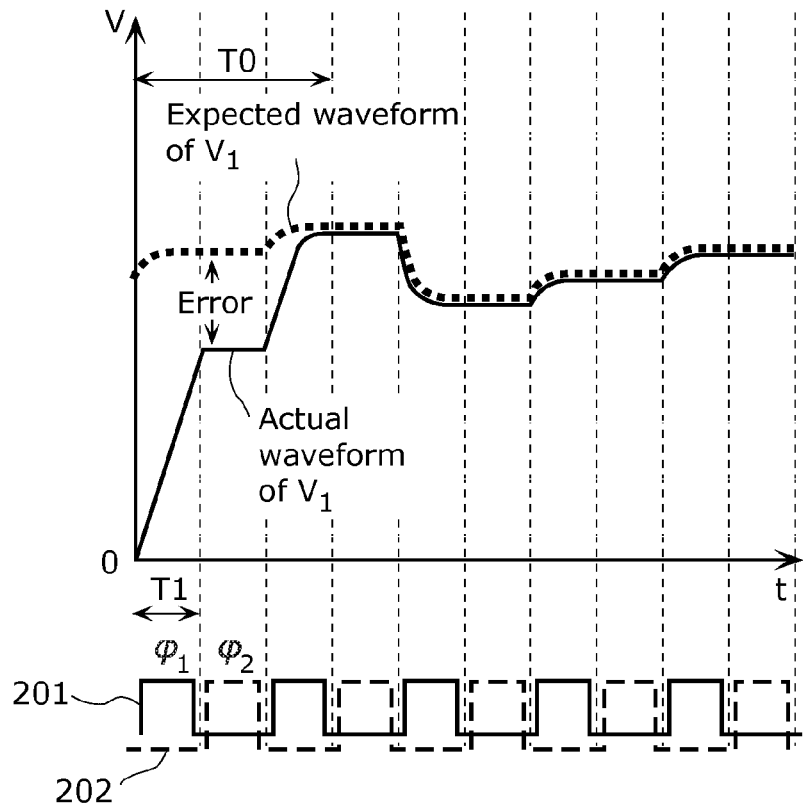
FIG. 2 is a diagram showing a problem to be solved in the embodiment, and is a timing chart showing an example of an internal waveform of the AD converter.

As shown in FIG. 2, in the initial transition period T0 of the output voltage $V_1$, an error is observed between the actual waveform and the expected waveform of the output voltage $V_1$. This is because a voltage variation necessary in the initial transition period is greater compared to the amplitude of the amplifier in a steady operation. Moreover, this is because, in a power-saving amplifier designed to operate most efficiently in a steady operation, an output node of the amplifier 101 is not sufficiently driven in the first operating period T1 after a reset release. In this example, the operating period T1 corresponds to the first high period of a clock signal 201 in FIG. 2.

It is to be noted that the same is true of an output voltage from an amplifier 102.

Moreover, as described in NPL 1, in the case of a 2nd- or higher-order ΔΣ AD converter, the accuracy can be amplified by applying decimation in which digital pulses resulting from the AD conversion are weighted. However, in the case of the 2nd- or higher-order ΔΣ AD converter, a digital code in the first one cycle is the most heavily weighted. Thus, when the digital code in the first one cycle has an error, an error resulting from the decimation processing is large. That is, the above problem is more significant in the 2nd- or higher-order ΔΣ AD converter.

Moreover, a method for increasing a driving capability of the amplifier 101 may be employed as a simple method to solve this problem. However, an increase in the driving capability of the amplifier 101 leads to an increase in power consumption of the AD converter. Specifically, in an image-capturing element having a great number of AD converters for example, an increase in power consumption of the AD converter greatly affects an increase in power consumption of the element as a whole. Furthermore, in the case where such an image-capturing element is used in a battery-driven apparatus which requires power saving.

In view of this, in this embodiment, an AD conversion circuit which is capable of improving accuracy by reducing an error between the expected waveform and the actual waveform after the reset release while suppressing an increase in power consumption.

In order to solve the aforementioned problem, the AD conversion circuit according to an aspect of the present invention is an analog-to-digital conversion circuit which converts an analog input signal into a digital output signal, the analog-to-digital conversion circuit including: a clock generating circuit which generates a clock signal including a first initial period and plural normal periods following the first initial period, the first initial period being one of a high period and a low period and being a first period immediately after a reset release, each of the normal periods being one of a high period and a low period and shorter than the first initial period; and an analog-to-digital converter which is an incremental analog-to-digital converter that operates using the clock signal, wherein the analog-to-digital converter includes: an integrator which generates an integrated value according to a voltage of the analog input signal; a comparator which generates the digital output signal by comparing the integrated value and a predetermined reference voltage; and a digital-to-analog converter which generates an analog signal according to the digital output signal and provides the generated analog signal to the integrator.

With this configuration, the AD conversion circuit according to an aspect of the present invention is capable of improving accuracy by reducing an error between the expected waveform and the actual waveform after the reset release while suppressing an increase in power consumption.

For example, the first initial period may have a length that is n times longer than a length of each of the normal periods, where n is an integer of two or more.

With this configuration, in view of a circuit configuration, the first initial period can be easily lengthened compared to the normal period by using a counter or the like.

For example, the analog-to-digital converter may be a ΔΣ modulator analog-to-digital converter.

For example, the normal periods may include a second period after the reset release in the clock signal and periods following the second period in the clock signal.

For example, the clock signal may further include a second initial period which is the second period after the reset release and longer than each of the normal periods.

For example, the analog-to-digital converter may further include a buffer circuit positioned between an output terminal of the integrator and an input terminal of the comparator.

With this configuration, the analog-digital conversion circuit according to an aspect of the present invention can ensure a transmission of a signal to the comparator.

For example, the analog-to-digital converter may further include a capacitance adder which generates a sum of the analog input signal and the integrated value, and the comparator may generate the digital output signal by comparing the sum and the reference voltage.

With this configuration, the analog-digital conversion circuit according to an aspect of the present invention is capable of widen a dynamic range of the AD converter.

For example, the analog-to-digital converter may further include a capacitance element for holding the sum which is connected to an output terminal of the capacitance adder.

With this configuration, the analog-digital conversion circuit according to an aspect of the present invention can ensure a transmission of a signal from the capacitance adder to the comparator.

Moreover, a battery monitoring system according to an aspect of the present invention includes the AD conversion circuit.

Moreover, a medical image diagnosis system according to an aspect of the present invention includes the image-capturing element.

Moreover, a method for driving an AD converter according to an aspect of the present invention is a method for driving an analog-to-digital converter which converts an analog input signal into a digital output signal, the analog-to-digital converter being an incremental analog-to-digital converter which operates using a clock signal and including: an integrator which generates an integrated value according to a voltage of the analog input signal; a comparator which generates the digital output signal by comparing the integrated value and a predetermined reference voltage; and a digital-to-analog converter which generates an analog signal according to the digital output signal and provides the generated analog signal to the integrator, the method including providing, to the analog-to-digital converter, a clock signal including a first initial period and plural normal periods following the first initial period, the first initial period being one of a high period and a low period and being a first period immediately after a reset release, each of the normal periods being one of a high period and a low period and shorter than the first initial period.

For example, the first initial period has a length that is n times longer than a length of each of the normal periods, where n is an integer of two or more It is to be noted that these general and specific aspects may be implemented using a system, a method, or an integrated circuit, and any combination of systems, methods, and integrated circuits.

Hereinafter, embodiments of the present invention are described in detail with reference to the drawings. It is to be noted that the same reference numerals are assigned to the same or corresponding elements in the drawings and the descriptions thereof may be omitted.

It is to be noted that the embodiment described below shows a general or specific example of the present disclosure. Therefore, the numerical values, shapes, materials, structural elements, the arrangement and connection of the structural elements, steps, the processing order of the steps etc. shown in the following exemplary embodiment are mere examples, and therefore do not limit the scope of the present disclosure. Moreover, among the constituent elements in the following embodiments, constituent elements not recited in any one of the independent claims defining the most generic part of the inventive concept are described as optional constituent elements.

(Embodiment 1)

In an AD conversion circuit according to Embodiment 1 of the present invention, the initial operating period after the reset release (high period or low period) is increased. With this, the AD conversion circuit is capable of improving accuracy by reducing an error between the expected waveform and the actual waveform after the reset release while suppressing an increase in power consumption.

Figure 3:
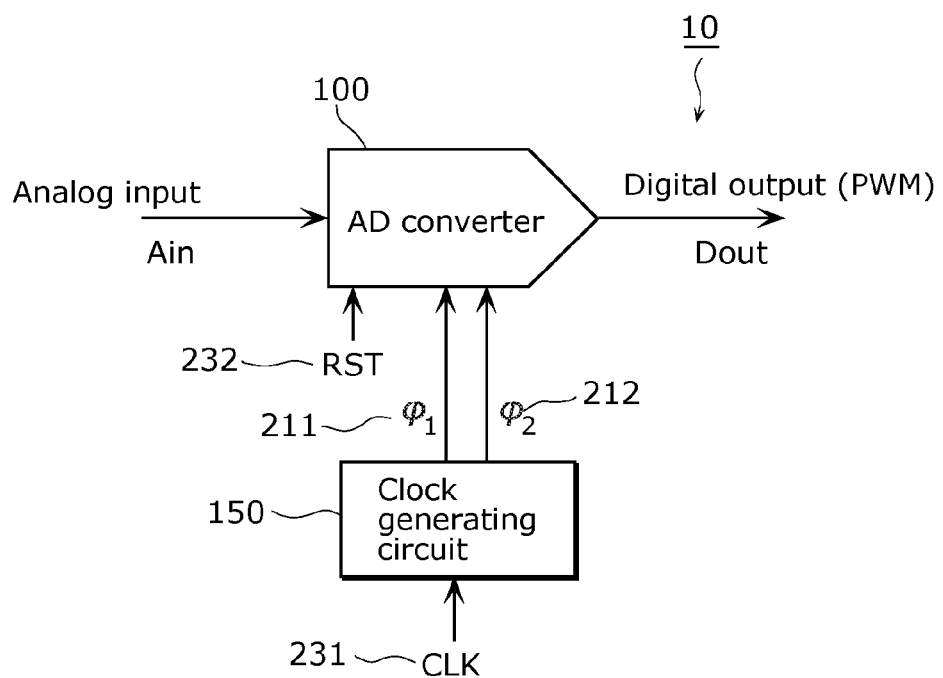
FIG. 3 is a block diagram showing an AD conversion circuit according to Embodiment 1.

FIG. 3 is a diagram showing a configuration of the AD conversion circuit according to Embodiment 1 of the present invention. The AD conversion circuit 10 shown in FIG. 3 converts an analog input signal Ain into a digital output signal Dout. The AD conversion circuit 10 includes an AD converter 100 and a clock generating circuit 150.

The AD converter 100 is, for example, a 2nd-order ΔΣ AD converter shown in FIG. 1, and operates using and in synchronization with a clock signal 211 ($\phi_1$) and a clock signal 212 ($\phi_2$).

The AD converter 100 shown in FIG. 1 includes integrators 130 and 131, a comparator 103, a one-bit DA converter 104, capacitors 105 and 107, and switches 111 to 114 and 121 to 124.

An analog input terminal which receives the analog input signal Ain is connected to the input terminal of the integrator 130 via the switch 111, the capacitor 105 and the switch 122. Moreover, the node between the capacitor 105 and the switch 122 is connected to a ground potential line (GND) via the switch 112.

The output terminal of the integrator 130 is connected to the input terminal of the integrator 131 via the switch 123, the capacitor 107, and the switch 114. Moreover, the node between the capacitor 107 and the switch 123 is connected to the GND via the switch 113. Moreover, the node between the capacitor 107 and the switch 114 is connected to the GND via the switch 124. A parasitic capacitor 109 is connected between the output terminal of the integrator 131 and the GND.

The integrator 130 includes the amplifier 101 and the capacitor 106. The integrator 131 includes the amplifier 102 and the capacitor 108.

The comparator 103 is connected to the output terminal of the integrator 131. The comparator 103 compares an output signal of the integrator 131 and a predetermined reference voltage Vref, and outputs the digital output signal Dout indicating a magnitude relationship between the output signal of the integrator 131 and the reference voltage Vref.

The DA converter 104 outputs an analog signal according to a logical value of the digital output signal Dout. The switch 121 is connected between the node between the switch 111 and the capacitor 105 and the output terminal of the DA converter 104.

Switches 111 to 114 are switched ON and OFF according to the clock signal $\phi_1$. Switches 121 to 124 are switched ON and OFF according to the clock signal $\phi_2$. For example, these switches are turned ON when a supplied clock signal is in a high level, and turned OFF when the supplied clock signal is in a low level. It is to be noted that these switches may be turned ON when the supplied clock signal is in the low level. In this case, the logic of the clock signals $\phi_1$ and $\phi_2$ in the example of this embodiment should be reversed.

It is to be noted that the AD converter 100 is not limited to the 2nd-order ΔΣ AD converter, but may be a 1st-order ΔΣ AD converter or a 3rd- or higher-order ΔΣ AD converter. Moreover, the AD converter 100 may be an incremental AD converter other than the ΔΣ AD converter. Specifically, the AD converter 100 should be an incremental AD converter including at least one or more integrators each of which generates an integrated value according to the voltage of the analog input signal Ain, a comparator which compares the above integrated value and a predetermined reference voltage to generate a digital output signal Dout, and a digital-to-analog converter which generates an analog signal according to the digital output signal Dout and provides (feeds back) the generated analog signal to the integrator. For example, the AD converter 100 may be a cyclic AD converter.

Figure 4:
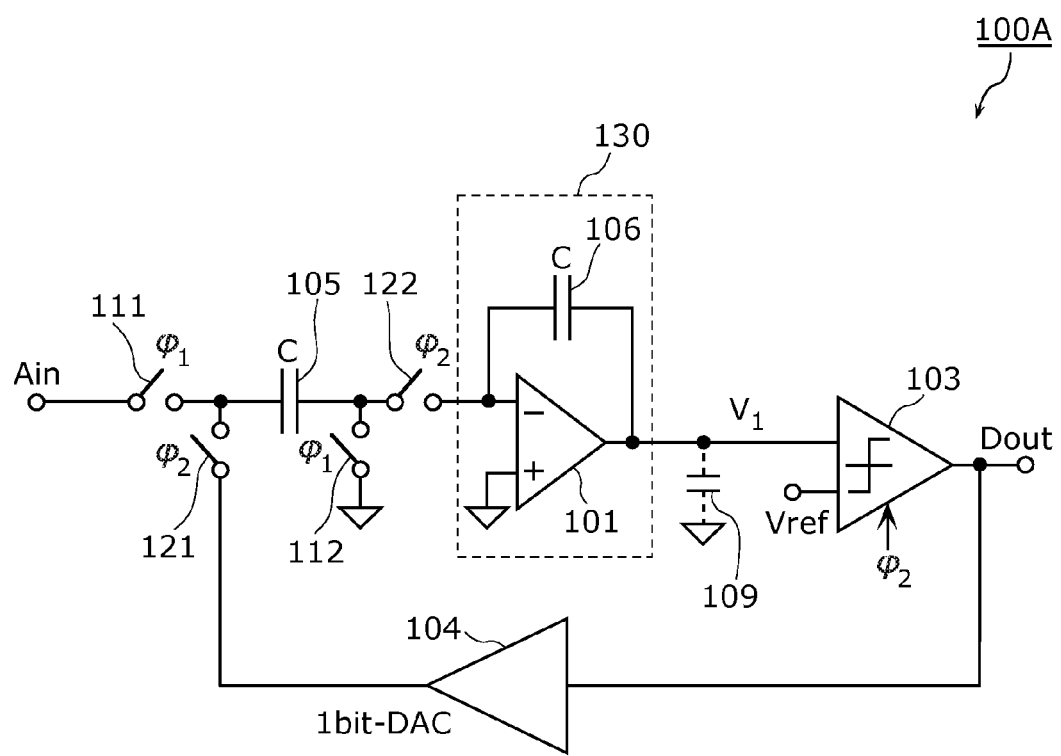
FIG. 4 is a circuit diagram showing an example of a ΔΣ AD converter according to Embodiment 1.

First, an outline of operations of the ΔΣ AD converter is described. It is to be noted that the following describes operations of a 1st-order ΔΣ AD converter for the sake of simplification. FIG. 4 is a circuit diagram showing the 1st-order ΔΣ AD converter 100A.

Figure 5:
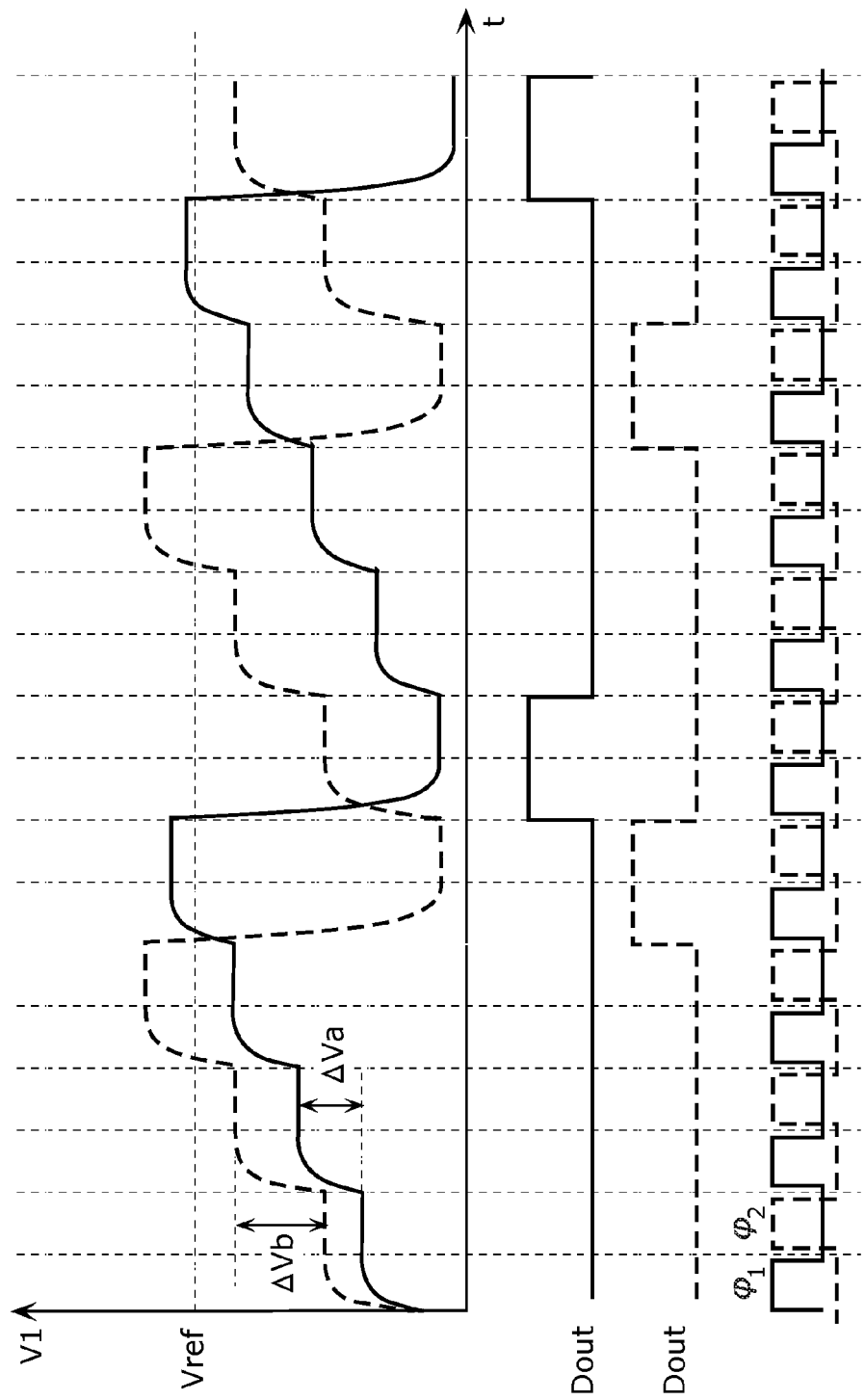
FIG. 5 is a timing chart showing an operation of the ΔΣ AD converter according to Embodiment 1.

FIG. 5 is a timing chart for the AD converter 100A. In FIG. 5, a solid line denotes the output voltage $V_1$ and the digital output signal Dout when the analog input signal Ain is the first value, and a dotted line denotes the output voltage $V_1$ and the digital output signal Dout when the analog input signal Ain is the second value which is larger than the first value.

As shown in FIG. 5, when the clock signal $\phi_1$ is changed to the high level, electric charges according to the voltage of the analog input signal Ain are charged in the capacitor 105, and the electric charges in the capacitor 105 are integrated by the integrator 130. As a result, the output voltage $V_1$ increases by ΔVa per cycle (one cycle of the clock signal). Moreover, when the output voltage $V_1$ is smaller than the reference voltage Vref, the comparator 103 outputs a low digital output signal Dout. Thus, the DA converter 104 outputs, for example, 0 V (GND level).

When the output voltage $V_1$ becomes larger than the reference voltage Vref, the logic for the digital output signal Dout is reversed. Accordingly, the DA converter 104 outputs a predetermined analog voltage value (for example, VDD). As a result, the output voltage $V_1$ of the integrator 130 is reset. Subsequently, the above operations are repeated.

According to the above operations, as shown in FIG. 5, the digital output signal Dout is changed to a high level in a cycle according to the analog voltage of the analog input signal Ain. Accordingly, a digital value corresponding to the analog input signal Ain can be determined based on the cycle.

Specifically, as shown by the dotted line in FIG. 5, when the analog voltage value of the analog input signal Ain is large, the amount of increase ΔVb in the output voltage $V_1$ per cycle increases. As a result, the cycle of the digital output signal Dout is shortened.

As described above, the ΔΣ AD converter 100 is capable of improving the conversion accuracy by increasing the number of conversion cycles.

Here, a description is given with reference to FIG. 3 again.

A clock generating circuit 150 generates the clock signal 211 ($\phi_1$) and the clock signal 212 ($\phi_2$) that are non-overlap clock signals whose active periods (high periods in this example) do not overlap with each other. FIG. 6 is a diagram showing an example of the clock signal 211 and the clock signal 212. As shown in FIG. 6, an initial period T2 which is the first period after the reset release among the high periods and the low periods of the clock signal 211 and the clock signal 212 (here, the high period of the clock signal 211) is longer than a normal period T3 following the initial period T2. With this, an error between the expected waveform and the actual waveform of the output voltage $V_1$ can be reduced.

Moreover, in a reset period, for example, both ends of each of the capacitors 105 to 108 included in the Ad converter 100 are shorted and the digital output signal Dout is fixed to a predetermined logic (for example, a low level).

Moreover, it is preferable that the length of the initial period T2 is sufficiently lengthened according to the period determined by driving capabilities of the amplifiers 101 and 102. In other words, the length of the initial period T2 is set to be long enough with respect to a time constant of the AD converter 100. Here, the time constant is a product of a capacitance value C of the capacitor 106 and an output impedance of the amplifier 101 included in the integrator 130. With this, the initial transition error described above can be reduced. Specifically, the ΔΣ AD converter 100 shown in FIG. 1 performs a comparing operation on a rising edge of the clock signal 212. That is, it is preferable that the error between the expected waveform and the actual waveform be zero at this time. In other words, the length of the initial period T2 is preferably determined so that the expected waveform and the actual waveform of the output voltage $V_1$ match each other during the initial period T2. For example, a desired initial period T2 is at least twice longer than the normal period T3.

Moreover, in the example shown in FIG. 6, only the first period after the reset release among the high periods and the low periods included in the AD conversion period after the reset release is longer than each of the normal periods T3 which are the second period and the periods following it. In other words, the plural normal periods T3 include the second period after the reset release and the periods following it in the clock signals 211 and 212.

It is to be noted that as shown in FIG. 7, the clock generating circuit 150 may generate clock signals 221 and 222 shown in FIG. 7 instead of the above clock signals 211 and 212. The clock signals 221 and 222 are clock signals in which only a length of the first cycle is lengthened. That is, in the clock signals 221 and 222, the length of the first cycle T4 is longer than that of the following cycle T5. In other words, the clock signals 221 and 222 are clock signals in which the frequency is lowered by only one cycle. For example, a desired length of the cycle T4 is at least twice longer than that of the cycle T5.

In other words, in the example shown in FIG. 7, only an initial period T6 which is the first period after the reset release and an initial period T7 which is the second period after the reset release, among the high periods and the low periods included in the AD conversion period after the reset release, each is longer than each of the normal periods T3 which are the third period and periods following it. That is, the clock signals 221 and 222 include the initial period T6 which is the first period after the reset release and longer than the normal period T3, and the initial period T7 which is the second period after the reset release and longer than the normal period T3.

Here, whether desired clock signals are the clock signals 211 and 212 shown in FIG. 6 or the clock signals 221 and 222 shown in FIG. 7 depends on functions of a peripheral circuit. Specifically, for example, when the peripheral circuit has a function to change the frequency of the clock signal, by using this function, the change in the frequency shown in FIG. 7 can be realized without an additional circuit. On the other hand, as described above, it is required that the expected waveform and the actual waveform of the output voltage $V_1$ match each other before the rising edge of the clock signal $\phi_2$. Therefore, the lengthening of only the first initial period as shown in FIG. 6 is appropriate to satisfy the request while suppressing an increase in the whole processing time.

As described above, the AD conversion circuit 10 according to this embodiment is capable of performing the AD conversion without degrading the accuracy even when powers of the respective components in the AD converter 100 are saved. Moreover, a power of the individual AD converter 100 can be saved, so that a high-definition image-capturing element having more pixels than the conventional image-capturing element can be realized.

Moreover, the clock generating circuit 150 generates the clock signals 211 and 212 (or the clock signals 221 and 222) using a clock signal 231 which is a non-overlapped clock signal for example.

Figure 8:
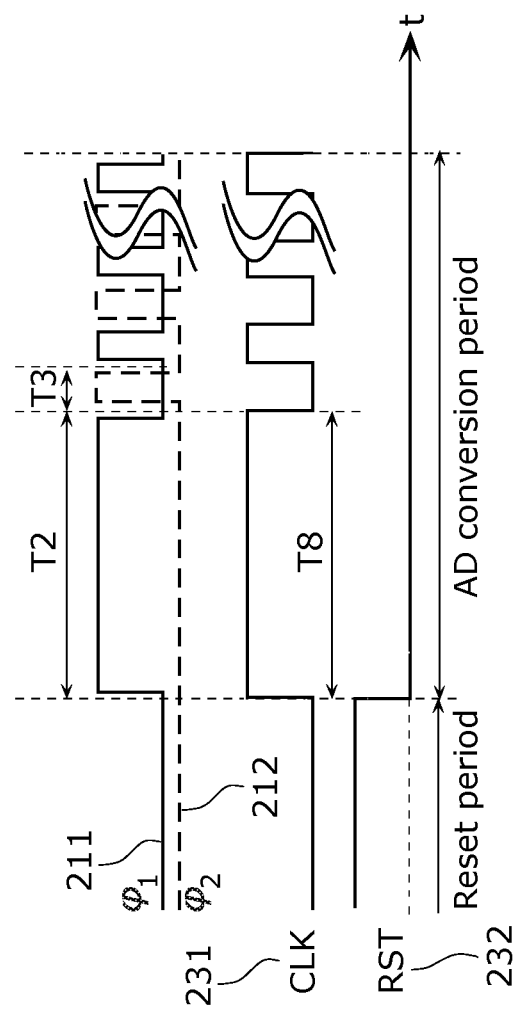
FIG. 8 is a timing chart showing examples of a clock signal and a reset signal according to Embodiment 1.

FIG. 8 is a diagram showing an example of the clock signal 231 and the reset signal 232. As shown in FIG. 8, in the clock signal 231, an initial period T8 which is at least the first operation period after the time when the reset signal 232 becomes non-active (in this example, a high period) is set to be longer than each of the high and low periods following the initial period T8. The length of the initial period T8 is set to be long enough with respect to a time constant of the AD converter 100. With this, the initial transition error can be reduced.

It is to be noted that the generating circuit 150 may generate the clock signals 211 and 212 (or the clock signals 221 and 222) using a normal clock signal having a constant frequency. For example, it is possible to generate the clock signals 211 and 212 (or the clock signals 221 and 222) from the normal clock signal using a delay circuit or a frequency divider.

Furthermore, the clock generating circuit 150 may have a function to generate the normal clock signal or the clock signal 231.

Figure 9:
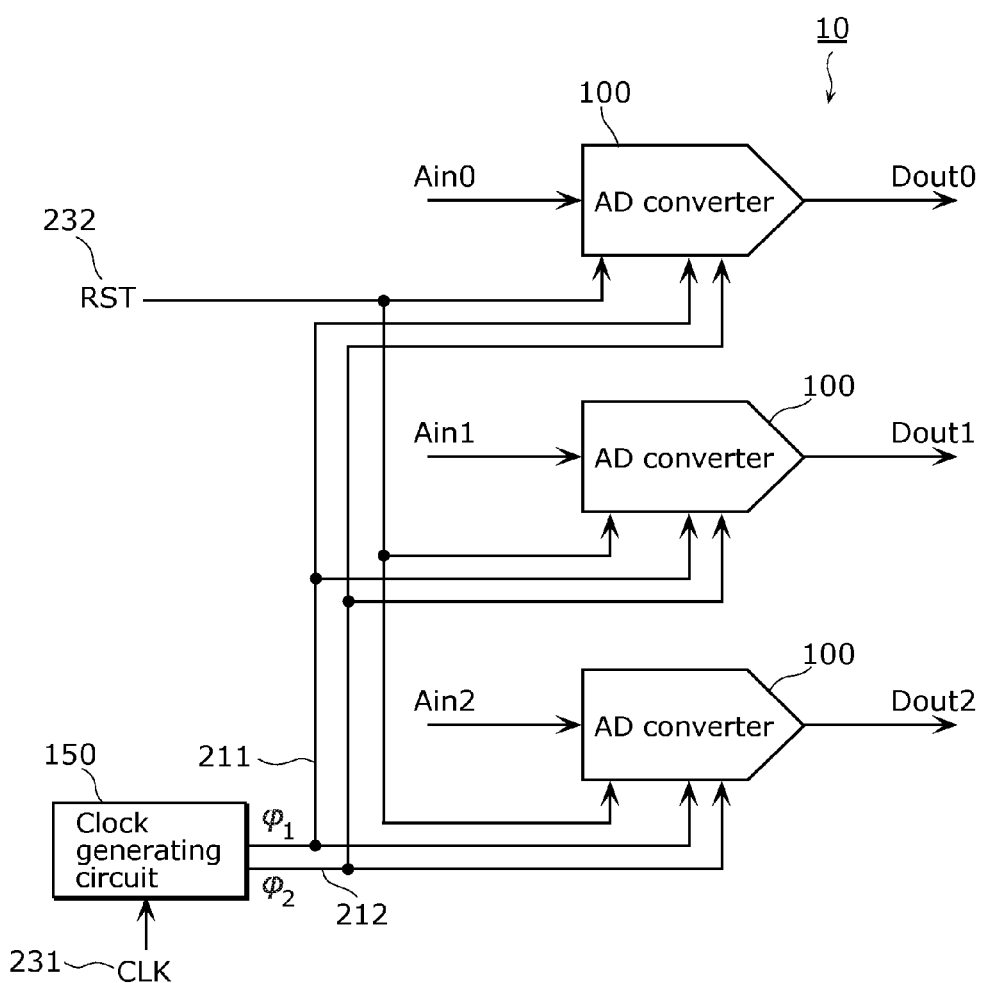
FIG. 9 is a block diagram showing a variation of the AD conversion circuit according to Embodiment 1.

Moreover, the clock generating circuit 150 need not to be provided for each AD converter 100 but may be shared by plural AD converters 100. For example, as shown in FIG. 9, the clock signals 211 and 212 generated by a single clock generating circuit 150 may be supplied to plural AD converters 100.

In the AD conversion circuit 10 according to Embodiment 1 of the present invention, the initial period which is the first operating period after the reset release (high period or low period) is lengthened. With this, the AD conversion circuit 10 is capable of reducing an error between the expected waveform and the actual waveform after the reset release while suppressing an increase in power consumption.

In view of design facilitation, it is more preferable that the length of the initial period T2 is n times longer than the length of the normal period T3, where n is an integer of two or more. Hereinafter, a description is given with reference to FIGS. 10 and 11.

Figure 10:
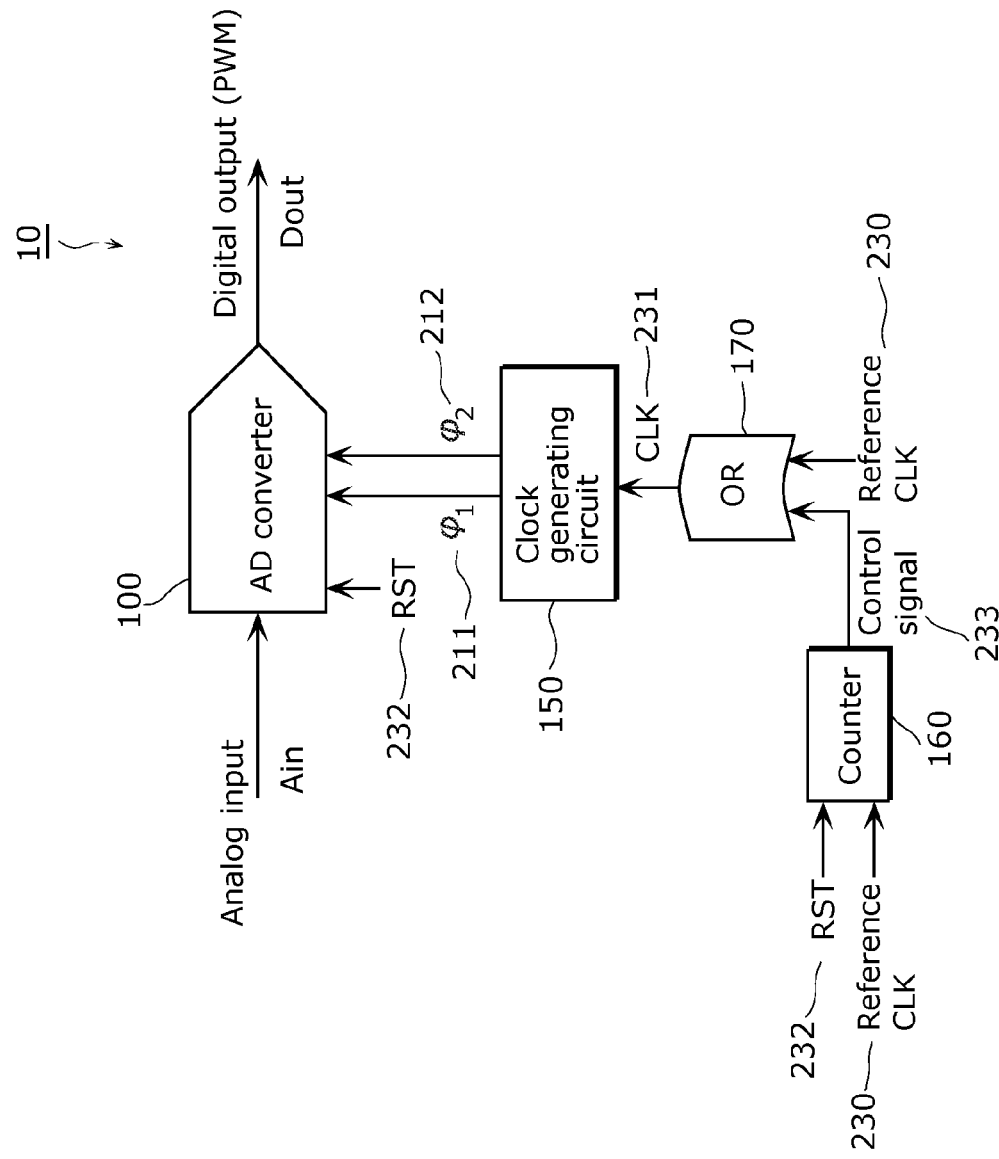
FIG. 10 is a block diagram showing the AD conversion circuit according to Embodiment 1.
Figure 11:
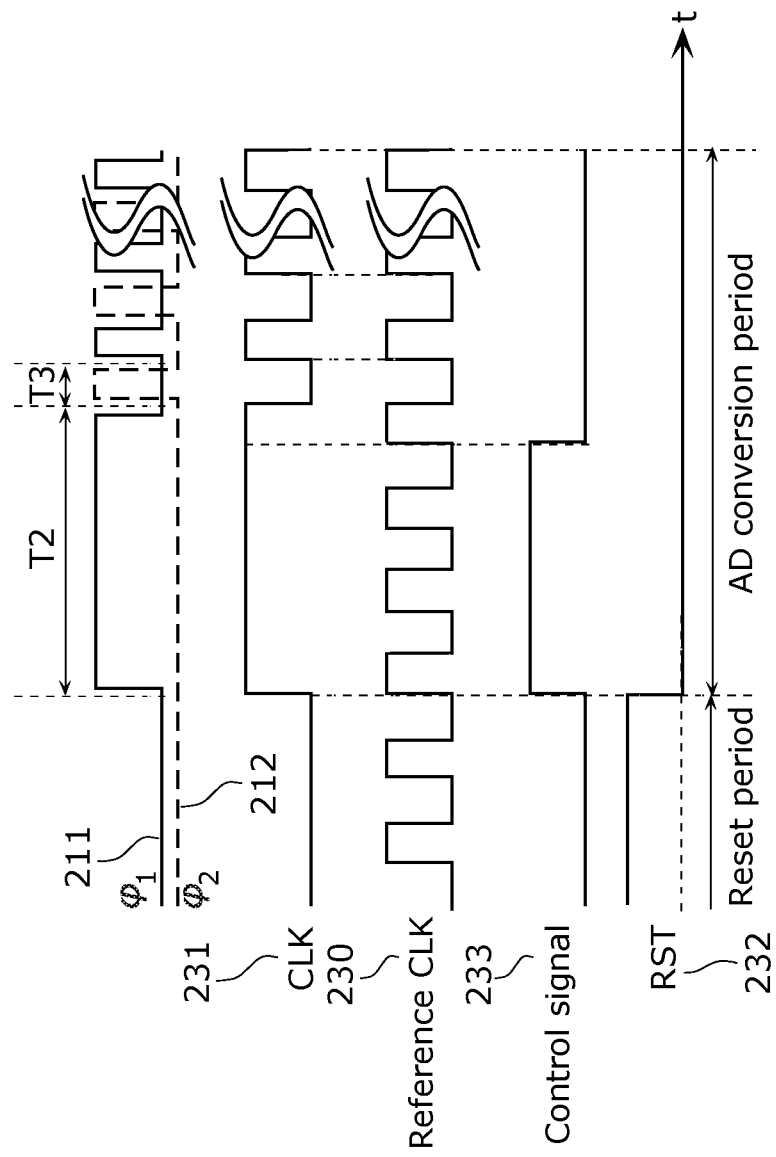
FIG. 11 is a timing chart showing examples of a clock signal and a reset signal according to Embodiment 1.

The AD conversion circuit 10 shown in FIG. 10 further includes a counter 160 and an OR circuit 170 in addition to the configuration of the AD conversion circuit 10 as shown in FIG. 3. The counter 160 is driven by a reset signal 232 and a reference clock signal 230 having a constant cycle and a constant duty ratio (ratio between the length of the high period and the length of the low period). Moreover, the counter 160 generates a control signal 233 as shown in FIG. 11 using the reset signal 232 and the reference clock signal 230. The OR circuit 170 generates a clock signal 231 which is a logical sum of the control signal 233 and the reference clock signal 230, and supplies the generated clock signal 231 to the clock generating circuit 150. With this configuration, the clock signal 231 can be easily generated. It is to be noted that FIG. 11 shows an example in which the length of the initial period T2 is seven times longer than the length of the normal period T3.

(Embodiment 2)

In this embodiment, a feedforward 2nd-order ΔΣ AD converter according to the present invention is described. It is to be noted that the following mainly describes differences from Embodiment 1 and overlapped descriptions are omitted.

The overall configuration of the AD conversion circuit according to this embodiment is the same as the configuration shown in FIG. 3 except that the AD converter 100 is replaced with the feedforward 2nd-order ΔΣ AD converter 300.

Figure 12:
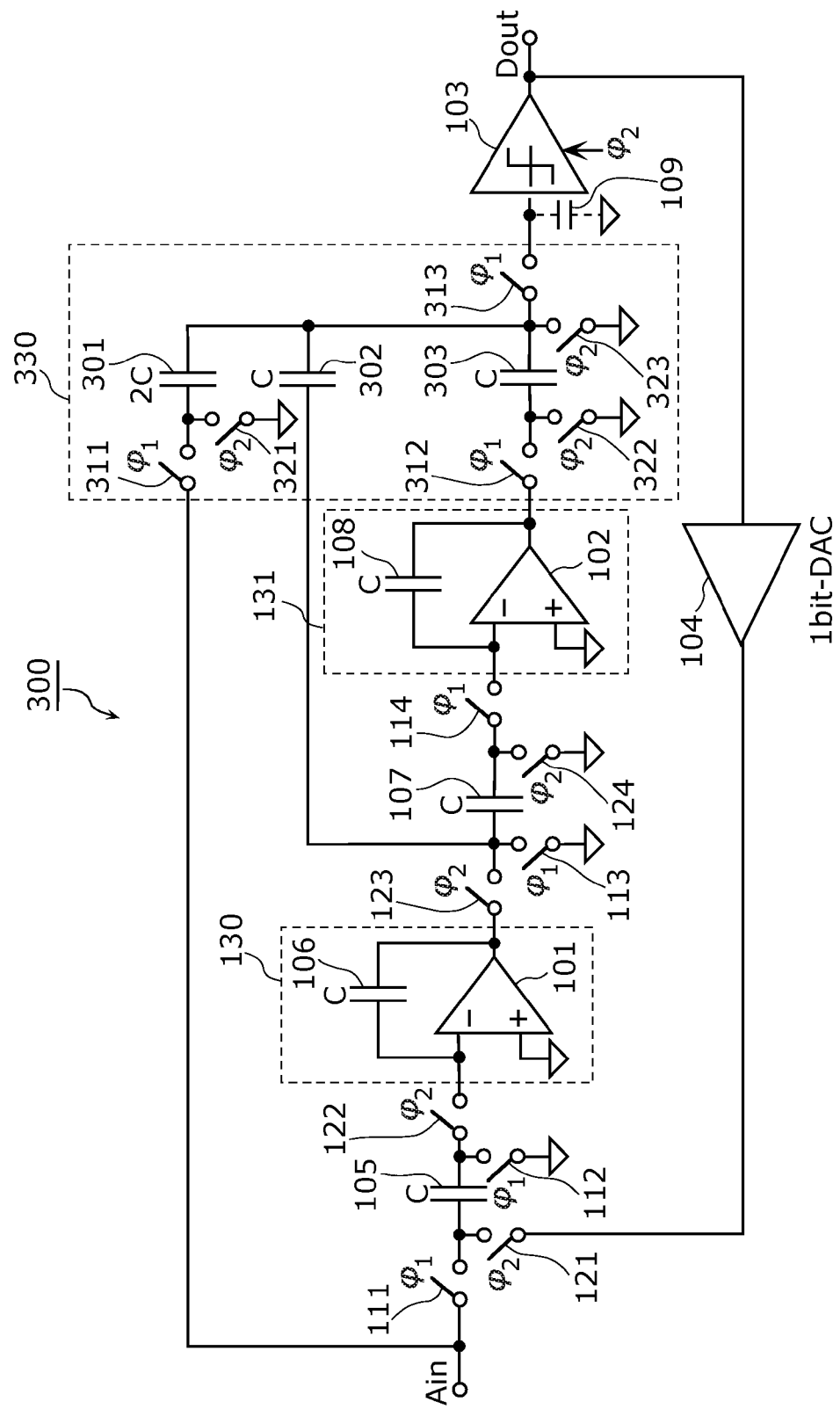
FIG. 12 is a circuit diagram showing a reference example of an AD converter according to Embodiment 2.

FIG. 12 is a circuit diagram showing the feedforward 2nd-order ΔΣ AD converter 300. The AD converter 300 further includes a capacitance adder 330 in addition to the configuration of the AD converter 100 shown in FIG. 1.

The capacitance adder 330 generates a sum of an analog input signal Ain, an integrated value generated in the integrator 130, and an integrated value generated in the integrator 131. Moreover, the comparator 103 generates a digital output signal Dout by comparing the sum generated by the capacitance adder 330 and the reference voltage Vref.

The capacitance adder 330 includes the capacitors 301, 302, and 303, and switches 311, 312, 313, 321, 322, and 323.

The capacitor 301 is provided in the bypass line from an analog input terminal for receiving the analog input signal Ain to the input terminal of the comparator 103. The capacitor 302 is positioned in the bypass line from the output terminal of the integrator 130 to the input terminal of the comparator 103. These bypass lines allow the electric power to bypass the original signal path through the integrators 130 and 131, and thus the voltage amplitude of the original signal path can be reduced. As a result, this has an effect to increase a dynamic range of the AD converter as a whole.

It is to be noted that NPL 2 discloses the feedforward 2nd-order ΔΣ AD converter 300.

However, in the configuration shown in FIG. 12, problems occur in an actual design. In view of the circuit configuration, it is reasonable to use, as the comparator 103, a latched comparator which is activated on a rising edge of the clock signal $\phi_2$. However, in this case, a problem arises in signal transmission from the capacitance adder 330 to the comparator 103. Specifically, a correct result of the adding of the capacitances is held only when the clock signal $\phi_1$ is in the high level, and thus the capacitance for holding the signal is only the parasitic capacitance 109 at an instant when the clock signal $\phi_1$ is changed to the low level. However, the parasitic capacitance 109 is normally only several femtofarads, and the signal held by the parasitic capacitance 109 is very sensitive to a noise. Accordingly, it is difficult to maintain this signal.

Figure 13:
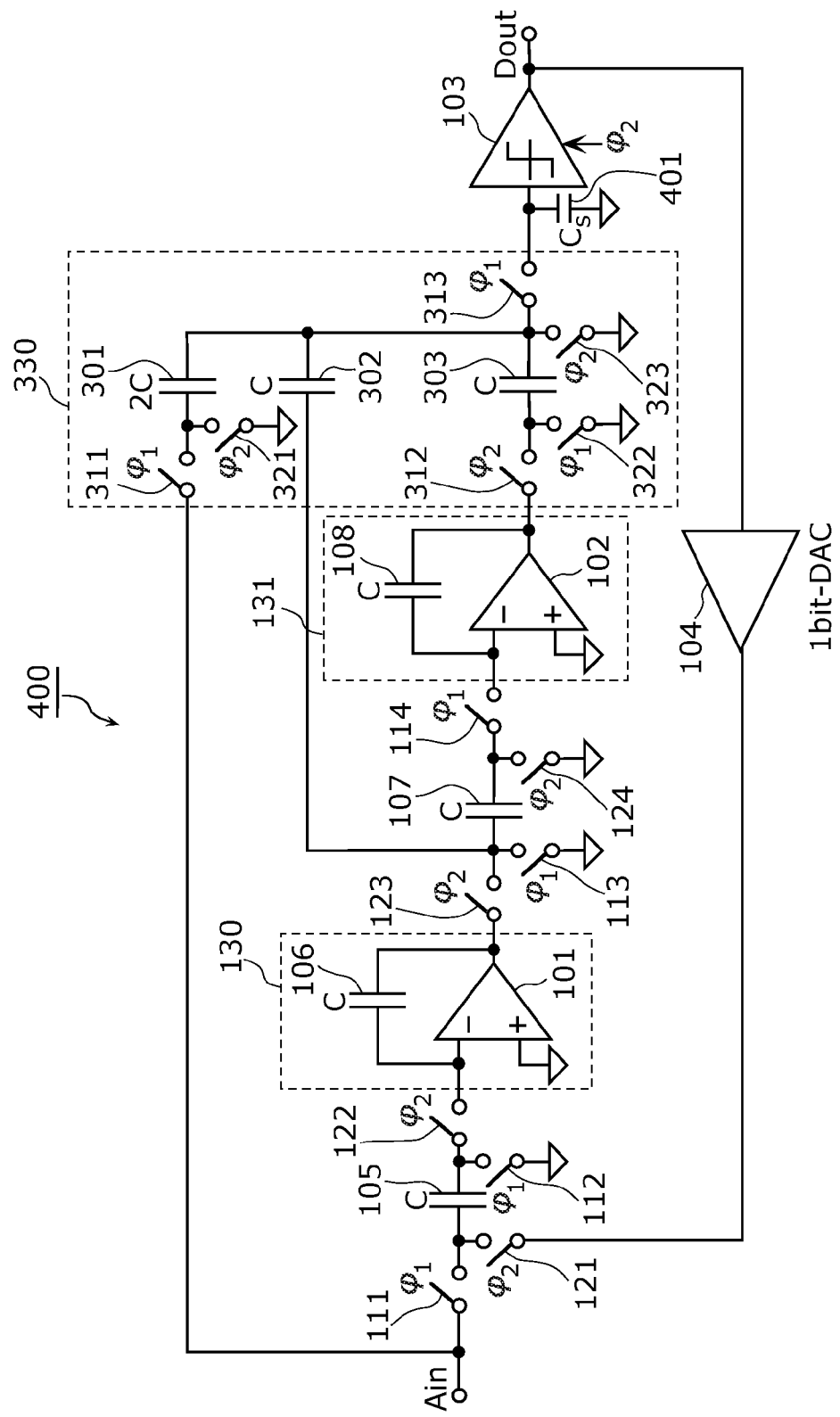
FIG. 13 is a circuit diagram showing an example of the AD converter according to Embodiment 2.

In this regard, as in the AD converter 400 shown in FIG. 13, when the parasitic capacitance 109 is replaced with the capacitor 401 having a sufficient capacitance (or the capacitor 401 is added), the signal transmission from the capacitance adder 330 to the comparator 103 can be ensured. Here, the capacitor 401 is a capacitance element for holding the sum generated in the capacitance adder 330, and has a capacitance that is at least 100 times greater than that of the parasitic capacitance 109 (at least several hundreds of femtofarads), for example.

Figure 14:
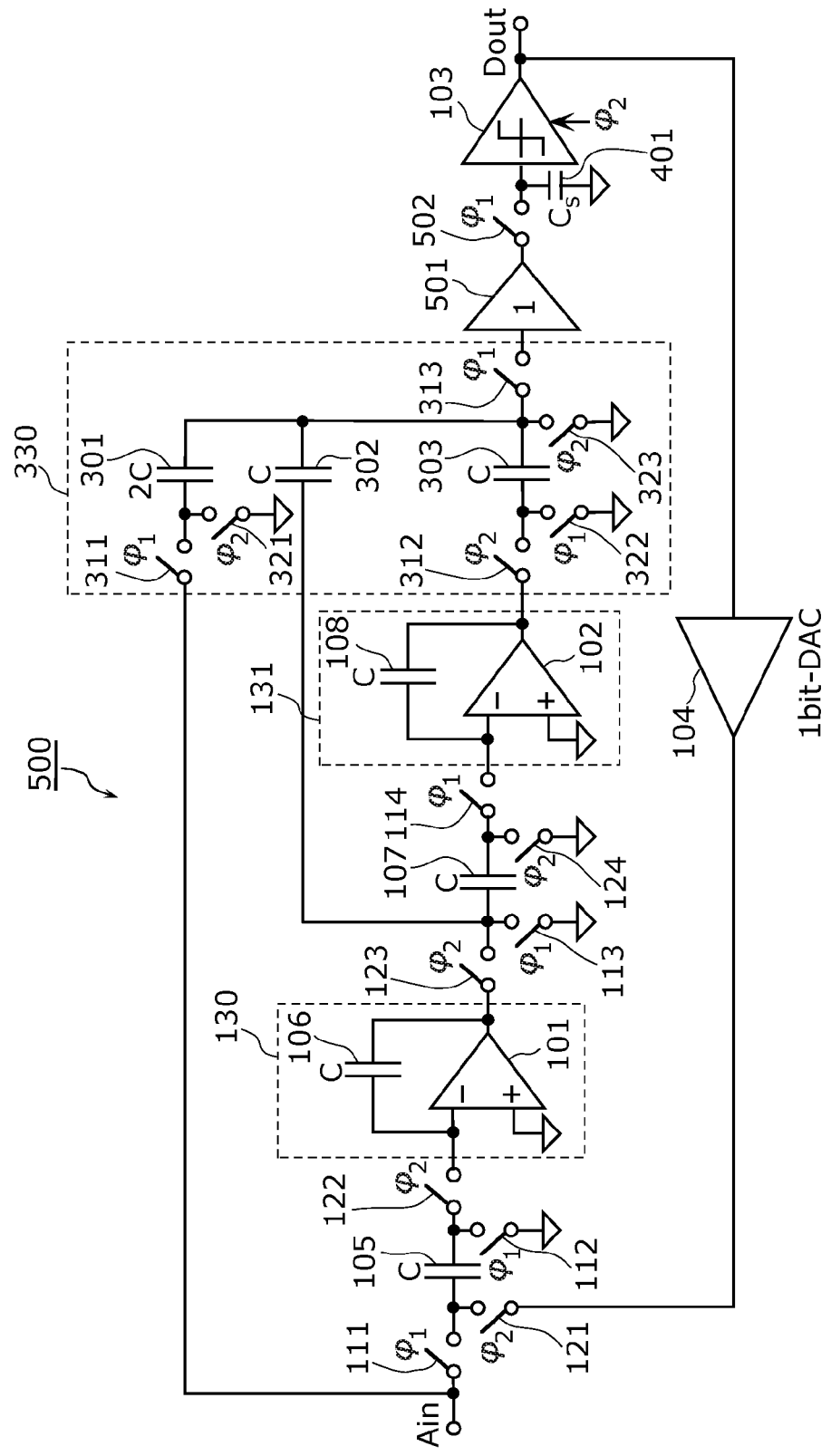
FIG. 14 is a circuit diagram showing a variation of the AD converter according to Embodiment 2.

Furthermore, as in the AD converter 500 shown in FIG. 14, a signal transmission circuit including a buffer circuit 501 and a switch 502 may be provided following the capacitance adder 330 and preceding the comparator 103. Thus, it is possible to separate the capacitance adder 330 and the capacitor 401 (or combined capacitance of the capacitor 401 and the parasitic capacitance 109). Here, since an input capacitance of the buffer circuit 501 is sufficiently small, the parasitic capacitance for the result of the adding of the capacitances is vanishingly small.

Figure 15:
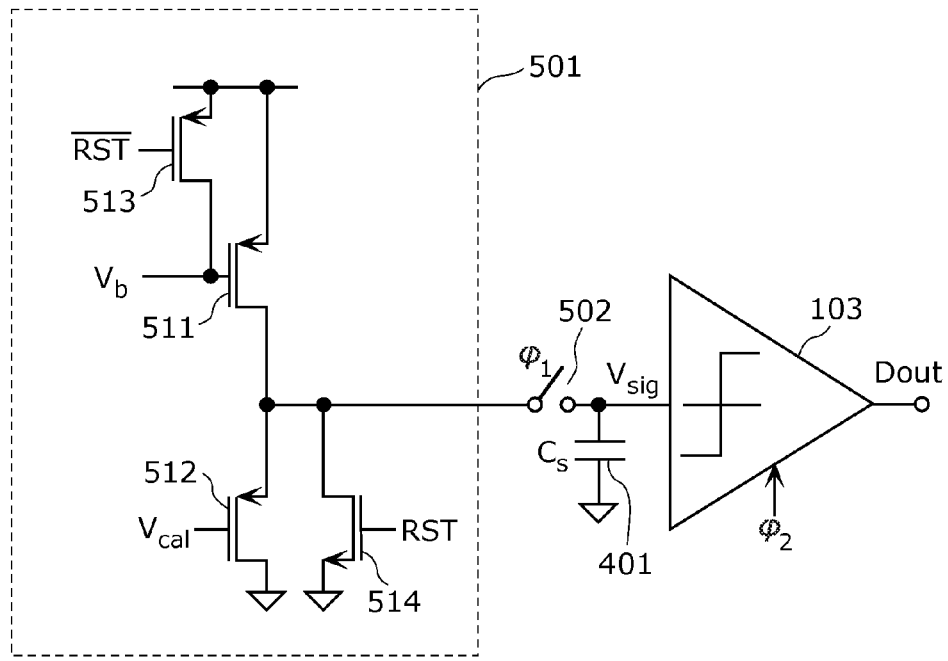
FIG. 15 is a circuit diagram showing an example of a buffer circuit according to Embodiment 2.

FIG. 15 is a circuit diagram showing this signal transmission circuit and the comparator 103. Some applications to which this embodiment is applied may insensitive to an offset of the result of the AD conversion, and thus the buffer circuit 501 is realized by a source follower circuit in FIG. 15. It is to be noted that the buffer circuit 501 may be realized by a circuit other than the source follower circuit.

Specifically, the buffer circuit 501 includes a transistor 511 which functions as a current source, a transistor 512 which is a drain ground circuit and receives an output voltage $V_{cal}$ of the capacitance adder 330, a transistor 513 which realizes a pull-up function for minimizing power consumption at the time of resetting, and a transistor 514 which realizes a pull-down function for minimizing power consumption at the time of the resetting.

Moreover, although an example in which the AD converter including the capacitance adder 330 further includes the buffer circuit 501 (signal transmission circuit), the AD converter without the capacitance adder 330 (for example, the AD converter 100 shown in FIG. 1) may further include the buffer circuit 501 (signal transmission circuit). That is, the buffer circuit 501 (signal transmission circuit) may be positioned between the output terminal of the integrator 131 and the input terminal of the comparator 103.

Figure 16:
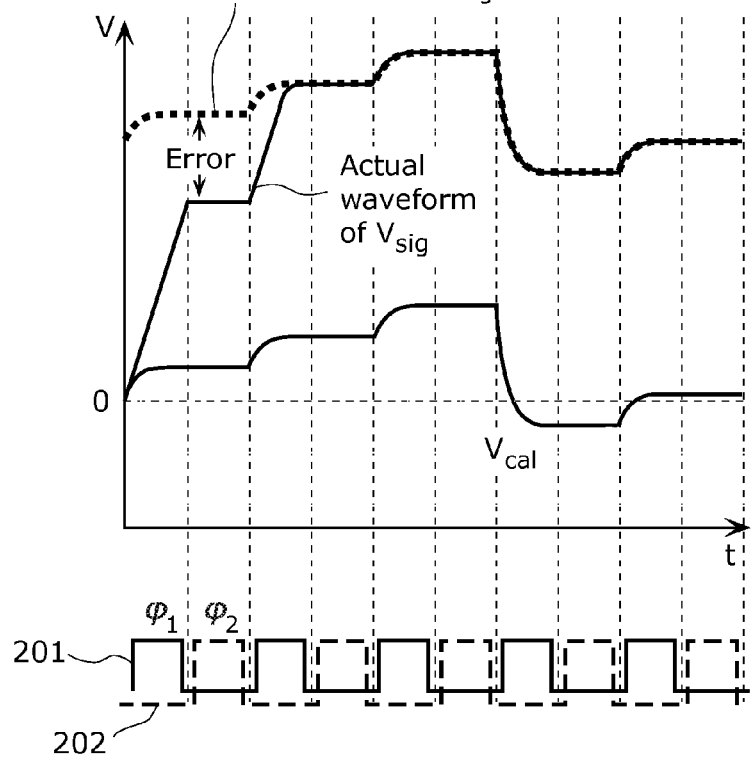
FIG. 16 is a diagram showing a problem to be solved in Embodiment 2, and is a timing chart showing an example of an internal waveform of the buffer circuit.

Here, in view of reducing of the power consumption, it is desirable that the operational power consumption of the buffer circuit 501 is suppressed to the extent that the signal bandwidth at the time of normal operation is just satisfied. However, in this case, the initial transition error is generated in the buffer circuit 501, too. FIG. 16 is a diagram showing a problem of this embodiment, and showing the expected waveform and the actual waveform of the input voltage $V_{sig}$ of the comparator 103 when the clock signals 201 and 202 having normal constant cycles are provided. As shown in FIG. 16, the same problem as in the output voltage $V_1$ in the above Embodiment 1 arises in the input voltage $V_{sig}$ of the comparator 103, too.

Figure 17:
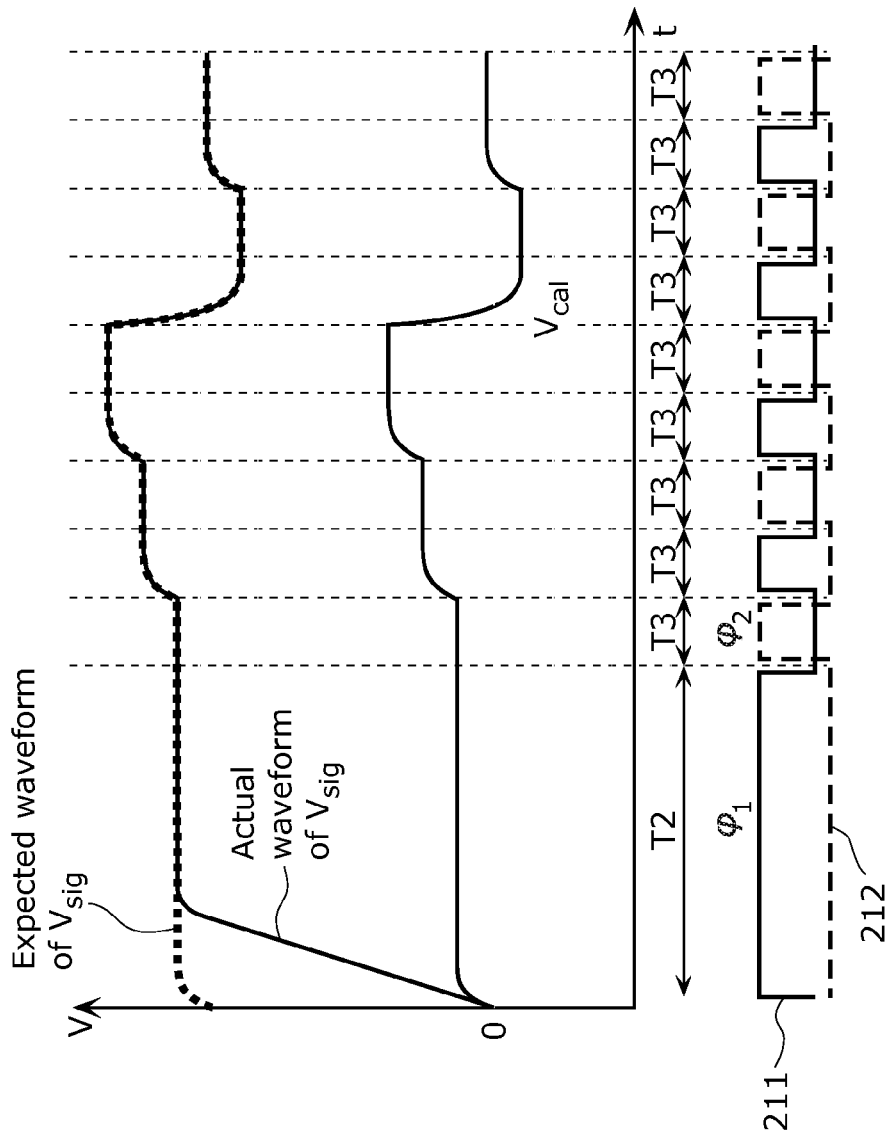
FIG. 17 is a timing chart showing the internal waveform of the AD converter according to Embodiment 2.

FIG. 17 is a diagram showing the expected waveform and the actual waveform of $V_{sig}$ in this embodiment. As shown in FIG. 17, in the same manner as the above Embodiment 1, it is possible to eliminate the initial transition error of the output voltage $V_1$ of the amplifier 101 and the initial transition error of the input voltage $V_{sig}$ of the comparator 103 by setting the initial period T2 which is the first period after the reset release sufficiently longer than the time constant of the source follower circuit of the buffer circuit 501.

Figure 18:
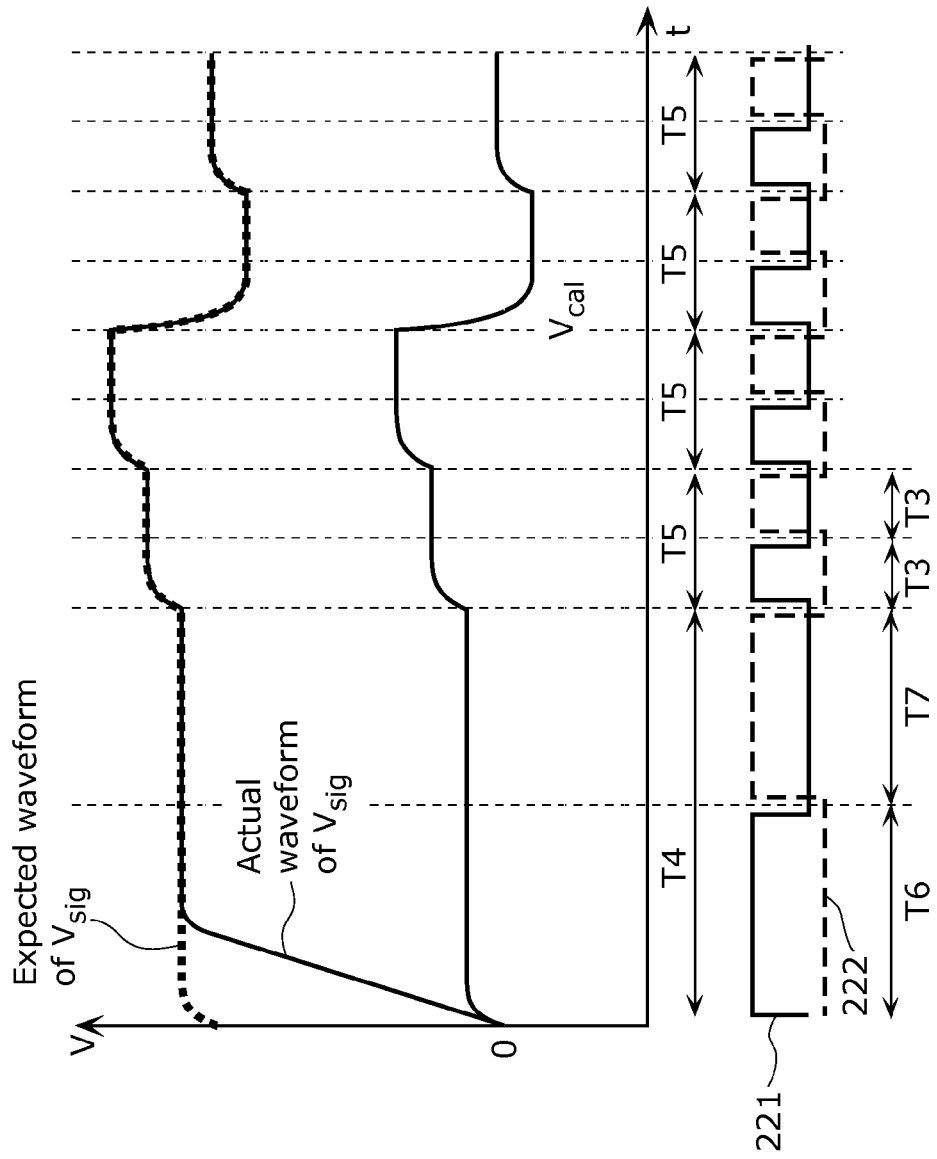
FIG. 18 is a timing chart showing the internal waveform of the AD converter according to Embodiment 2.

Moreover, as shown in FIG. 18, the clock signals 221 and 222 in which the first cycle T4 is lengthened may be used as the clock signals $\phi_1$ and $\phi_2$.

(Embodiment 3)

In this embodiment, an apparatus including the AD conversion circuit 10 described in the above Embodiment 1 or 2 is described.

Figure 19:
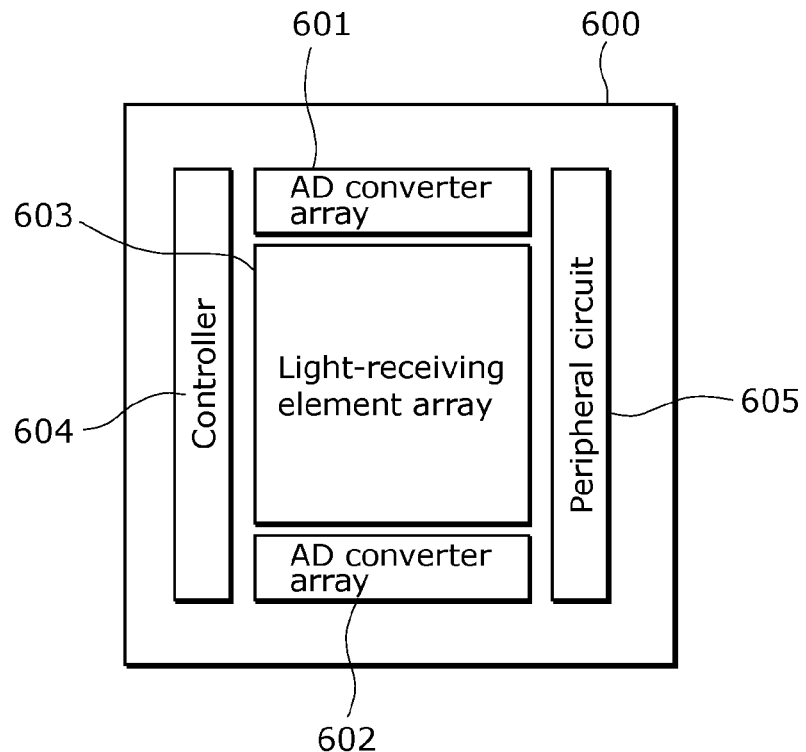
FIG. 19 is a diagram showing an image-capturing element according to Embodiment 3.

First, an image-capturing element 600 including the above AD conversion circuit 10 is described. FIG. 19 is a block diagram showing the image-capturing element 600 according to this embodiment. The image-capturing element 600 includes AD converter arrays 601 and 602, a light-receiving element array 603 in which plural light-receiving elements are arranged in a matrix, a controller 604, and a peripheral circuit 605.

In general, the number of pixels of the image-capturing element included in a CMOS imaging sensor is determined according to the sensitivity of the light-receiving element, but power consumption of the AD converter is also an important factor. In the case of a general column-parallel AD converter, the AD converter arrays 601 and 602 are positioned above and below the light-receiving element array 603. Moreover, several thousands of AD converters are provided to each of the AD converter arrays 601 and 602. Accordingly, the total power consumptions of these AD converters are large, and therefore an increase in the number of pixels is difficult because of problems of heat and battery lifetime.

On the other hand, by using the above AD conversion circuit 10, the consumed current of the incremental AD converter can be decreased to the requisite minimum. With this, it is possible to realize an increase in the number of pixels, a reduction of heat generation, and an increase in the battery lifetime. Accordingly, the AD conversion circuit 10 according to the above embodiment is fairly suitable for an apparatus in which plural AD converters are used, for example, an image-capturing element.

Moreover, the above image-capturing element 600 may be used in a digital camera such as a digital still camera or a digital camcorder.

Furthermore, the AD conversion circuit 10 according to the above embodiment may be used in other apparatuses.

Figure 20:
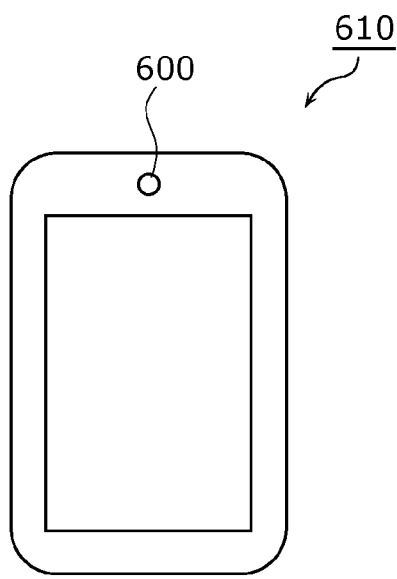
FIG. 20 is a diagram showing a mobile information terminal according to Embodiment 3.

For example, in a mobile information terminal such as a smart phone or a tablet terminal, a CMOS imaging sensor is included in its camera. Therefore, as shown in FIG. 20, the above image-capturing element 600 may be applied to a mobile information terminal 610. As a result, power consumption of the CMOS imaging sensor can be reduced, thereby increasing the battery lifetime.

Figure 21:
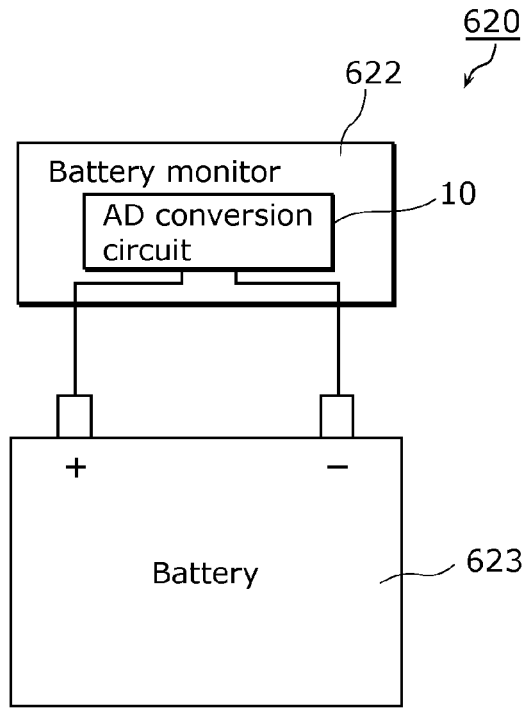
FIG. 21 is a diagram showing a battery monitoring system according to Embodiment 3.

Moreover, the above AD conversion circuit 10 may be applied to a battery monitoring system 620 as shown in FIG. 21. Specifically, the above AD conversion circuit 10 is used in a battery monitor 622 which monitors the battery 621. The AD conversion circuit 10 can reduce power consumption as described above, thereby simultaneously satisfying very small stand-by electricity and a very wide dynamic range. Thus, the above AD conversion circuit 10 is suitable for an in-vehicle battery monitoring system.

Figure 22:
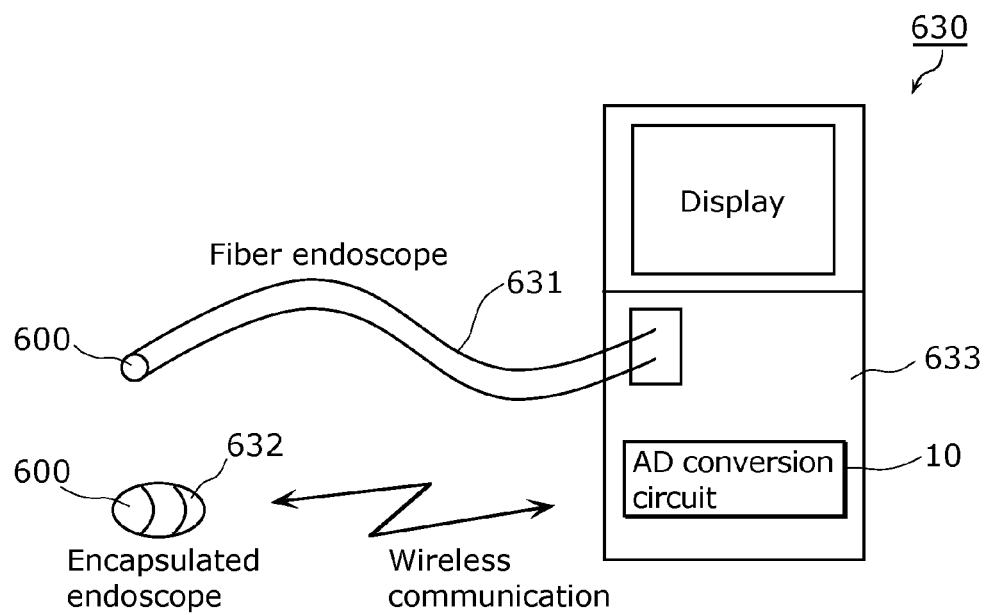
FIG. 22 is a diagram showing a medical image diagnosis system according to Embodiment 3.

Moreover, the above AD conversion circuit 10 may be applied to a medical image diagnosis system 630 as shown in FIG. 22. For example, implementation of the above image-capturing element 600 into a fiber endoscope 631 and others can realize a high-definition medical image diagnosis system 630 which generates less heat and has a wide dynamic range. Moreover, implementation of the above image-capturing element 600 into an encapsulated endoscope 632 can increase image-capturing time period. Moreover, the above AD conversion circuit 10 can also be applied to a medical image diagnosis apparatus 633.

Although the AD conversion circuit according to the embodiments and the apparatus including thereof has been described above, the present invention is not limited to the embodiments.

Moreover, processing units included in the AD conversion circuit and the image-capturing element according to the above embodiments are typically realized as LSIs which are integrated circuits. They may be made as separate individual chips, or as a single chip to include a part or all thereof.

Furthermore, the means for circuit integration is not limited to an LSI, and implementation with a dedicated circuit or a general-purpose processor is also available. It is also acceptable to use a Field Programmable Gate Array (FPGA) that is programmable after the LSI has been manufactured, and a reconfigurable processor in which connections and settings of circuit cells within the LSI are reconfigurable.

Moreover, at least a part of functions or configurations of the AD conversion circuit, the AD converter, and their modifications according to the above embodiments may be combined.

Moreover, all of numerals used in the above description is examples for specifically describing the present invention, and the present invention is not limited to the exemplified numerals. Furthermore, the logical levels indicated by high/low or the switching states indicated by ON/OFF are examples for specifically describing the present invention, and different combinations of the exemplified logical levels or the switching states can provide the equivalent result. Moreover, n-type and p-type of transistors and others are examples for specifically describing the present invention, and the equivalent result can be obtained by reversing them. Furthermore, connections between structural elements are mere examples for specifically describing the present invention, and therefore do not limit the connections which enable functions in the present invention.

Moreover, the division of the functional blocks in the block diagram is an example, and it is possible to implement plural functional blocks as a single functional block, divide a single functional block into plural functional blocks, or move a part of the functions to different functional block. Moreover, functions of plural functional blocks having similar functions may be processed in parallel or in time division.

Moreover, an example in which the MOS transistor is used is described above, other kinds of transistors may be used.

Moreover, the circuit configuration shown in the above circuit diagrams are mere examples, and the present invention is not limited to the above circuit configuration. That is, in the same manner as the above circuit configuration, a circuit which is capable of implementing characteristic functions of the present invention is included in the present invention. For example, within a range in which the same functions as those in the above circuit configuration can be realized, the present invention includes an element to which an element such as a switching element (transistor), a resistive element, and a capacitance element is connected in series or in parallel. In other words, "connected" in the above embodiment is not limited to the case where two terminals (nodes) are directly connected, but includes the case where the two terminals (nodes) are connected via an element within a range in which the same functions can be realized.

Although the AD conversion circuit according to one or more aspects of the present invention and the apparatus using thereof has been described based on the embodiments, the present invention is not limited to the embodiments. Various modifications to the embodiment that are conceived by the person skilled in the art and other embodiments obtainable by combining the structural elements in different embodiments without materially departing from the scope of the present disclosure may be included within the scope of an aspect or aspects of the present disclosure.

INDUSTRIAL APPLICABILITY

The present invention is applicable to an incremental AD converter. Moreover, the present invention is suitable for an image-capturing element using an AD converter. Furthermore, the present invention is useful in a digital still camera and a digital video camera each including image-capturing elements, and a terminal having the function of the cameras, for example, a mobile phone, a smart phone, a tablet terminal. Moreover, the present invention is also useful in an in-vehicle battery monitoring system and a medical image diagnosis system each including a voltage measuring AD converter for which an extremely wide dynamic range is required.

REFERENCE SIGNS LIST

10 AD conversion circuit
100, 100A, 300, 400, 500 AD converter
101, 102 Amplifier
103 Comparator
104 DA converter
105, 106, 107, 108, 301, 302, 303, 401 Capacitor
109 Parasitic capacitance
111, 112, 113,114, 121, 122, 123, 124, 311, 312, 313, 321, 322,
502 Switch
130, 131 Integrator
150 Clock generating circuit
160 Counter
1700R circuit
201, 202, 211, 212, 221, 222, 231 Clock signal
230 Reference clock signal
232 Reset signal
233 Control signal
330 Capacitance adder
501 Buffer circuit
511, 512, 513, 514 Transistor
600 Image-capturing element
601, 602 AD converter array
603 Light-receiving element array
604 Controller
605 Peripheral circuit
610 Mobile information terminal
620 Battery monitoring system
621 Battery
622 Battery monitor
630 Medical image diagnosis system
631 Fiber endoscope
632 Encapsulated endoscope
633 Medical image diagnosis apparatus
Ain Analog input signal
Dout Digital output signal

The invention claimed is:

1. An analog-to-digital conversion circuit which converts an analog input signal into a digital output signal, the analog-to-digital conversion circuit comprising:
   a clock generating circuit which generates a clock signal including a first initial period and plural normal periods following the first initial period, the first initial period being one of a high period and a low period and being a first period immediately after a reset release, each of the normal periods being one of a high period and a low period and shorter than the first initial period; and
   an analog-to-digital converter which is an incremental analog-to-digital converter that operates using the clock signal,
   wherein the analog-to-digital converter includes:
   an integrator which generates an integrated value according to a voltage of the analog input signal;
   a comparator which generates the digital output signal by comparing the integrated value and a predetermined reference voltage; and
   a digital-to-analog converter which generates an analog signal according to the digital output signal and provides the generated analog signal to the integrator.

2. The analog-to-digital conversion circuit according to claim 1,
   wherein the first initial period has a length that is n times longer than a length of each of the normal periods, where n is an integer of two or more.

3. The analog-to-digital conversion circuit according to claim 1,
   wherein the analog-to-digital converter is a ΔΣ modulator analog-to-digital converter.

4. The analog-to-digital conversion circuit according to claim 1,
   wherein the normal periods include a second period after the reset release in the clock signal and periods following the second period in the clock signal.

5. The analog-to-digital conversion circuit according to claim 1,
   wherein the clock signal further includes a second initial period which is the second period after the reset release and longer than each of the normal periods.

6. The analog-to-digital conversion circuit according to claim 1,
   wherein the analog-to-digital converter further includes a buffer circuit positioned between an output terminal of the integrator and an input terminal of the comparator.

7. The analog-to-digital conversion circuit according to claim 1, wherein the analog-to-digital converter further includes
a capacitance adder which generates a sum of the analog input signal and the integrated value, and
the comparator generates the digital output signal by comparing the sum and the reference voltage.

8. The analog-to-digital conversion circuit according to claim 7,
wherein the analog-to-digital converter further includes
a capacitance element for holding the sum which is connected to an output terminal of the capacitance adder.

9. An image-capturing element comprising
the analog-to-digital conversion circuit according to claim 1.

10. A digital camera comprising
the image-capturing element according to claim 9.

11. A mobile information terminal comprising
the image-capturing element according to claim 9.

12. A battery monitoring system comprising
the analog-to-digital conversion circuit according to claim 1.

13. A medical image diagnosis system comprising
the image-capturing element according to claim 9.

14. A method for driving an analog-to-digital converter which converts an analog input signal into a digital output signal,
the analog-to-digital converter
being an incremental analog-to-digital converter which operates using a clock signal and
including:
an integrator which generates an integrated value according to a voltage of the analog input signal;
a comparator which generates the digital output signal by comparing the integrated value and a predetermined reference voltage; and
a digital-to-analog converter which generates an analog signal according to the digital output signal and provides the generated analog signal to the integrator,
the method comprising
providing, to the analog-to-digital converter, a clock signal including a first initial period and plural normal periods following the first initial period, the first initial period being one of a high period and a low period and being a first period immediately after a reset release, each of the normal periods being one of a high period and a low period and shorter than the first initial period.

15. The method for driving the analog-to-digital converter according to claim 14,
wherein the first initial period has a length that is n times longer than a length of each of the normal periods, where n is an integer of two or more.

* * * * *

UNITED STATES PATENT AND TRADEMARK OFFICE
CERTIFICATE OF CORRECTION

PATENT NO. : 8,912,941 B2  
APPLICATION NO. : 14/116294  
DATED : December 16, 2014  
INVENTOR(S) : Yusuke Tokunaga Page 1 of 1

It is certified that error appears in the above-identified patent and that said Letters Patent is hereby corrected as shown below:

On the Title Page, Item (54), and in the Specification, Col. 1, Title:

"ANALOG-DIGITAL CONVERSION CIRCUIT AND METHOD FOR DRIVING THE SAME" should read

--ANALOG-TO-DIGITAL CONVERSION CIRCUIT AND METHOD OF DRIVING THE SAME--.

Signed and Sealed this  
Ninth Day of June, 2015

Michelle K. Lee  
*Director of the United States Patent and Trademark Office*